United States Patent
Friedman

(10) Patent No.: US 11,171,400 B2
(45) Date of Patent: Nov. 9, 2021

(54) LOOP GAP RESONATORS FOR SPIN RESONANCE SPECTROSCOPY

(71) Applicant: Amherst College, Amherst, MA (US)

(72) Inventor: Jonathan R. Friedman, Amherst, MA (US)

(73) Assignee: Amherst College, Amherst, MA (US)

( * ) Notice: Subject to any disclaimer, the term of this patent is extended or adjusted under 35 U.S.C. 154(b) by 0 days.

(21) Appl. No.: 16/123,029

(22) Filed: Sep. 6, 2018

(65) Prior Publication Data

US 2019/0074570 A1    Mar. 7, 2019

Related U.S. Application Data

(60) Provisional application No. 62/555,127, filed on Sep. 7, 2017.

(51) Int. Cl.
| | |
|---|---|
| *H01P 7/06* | (2006.01) |
| *G01R 33/343* | (2006.01) |
| *G01R 33/60* | (2006.01) |
| *G06N 10/00* | (2019.01) |
| *H01P 7/08* | (2006.01) |

(52) U.S. Cl.
CPC .............. *H01P 7/06* (2013.01); *G01R 33/343* (2013.01); *G01R 33/60* (2013.01); *G06N 10/00* (2019.01); *H01P 7/08* (2013.01)

(58) Field of Classification Search
CPC .... H01P 7/06; H01P 7/065; H01P 7/08; H01P 7/10; H01P 11/00; H01P 11/0008; G06N 10/00; G01R 33/343; G01R 33/60; G01R 33/34; G01R 27/2658; G01R 31/3824

USPC ............................................... 324/76.49, 316
See application file for complete search history.

(56) References Cited

U.S. PATENT DOCUMENTS

| | | | | |
|---|---|---|---|---|
| 4,446,429 A | * | 5/1984 | Froncisz | G01R 33/343 324/316 |
| 4,480,239 A | * | 10/1984 | Hyde | G01R 33/343 324/315 |
| 4,751,464 A | * | 6/1988 | Bridges | G01R 33/3678 324/318 |

(Continued)

FOREIGN PATENT DOCUMENTS

| | | | | |
|---|---|---|---|---|
| EP | 1132994 A1 | * | 9/2001 | .......... H01P 1/20372 |
| EP | 3679385 A1 | | 7/2020 | |

(Continued)

OTHER PUBLICATIONS

Rinard et al., Biomedical EPR, Part B: Methodology, Instrumentation, and Dynamics—Chapter 2 : Loop-Gap Resonators. vol. 24/B, 2005. (Year: 2005).*

(Continued)

*Primary Examiner* — Dixomara Vargas
*Assistant Examiner* — Sean Curtis
(74) *Attorney, Agent, or Firm* — Blueshift Ip, LLC; Robert Plotkin

(57) ABSTRACT

Improved loop-gap resonators applicable to Electron-Spin Resonance spectroscopy and to quantum computing employ interdigitated capacitor structures to dramatically increase the capacitance of the resonator, along with corresponding decreases in loop size to enable measurements of small-volume samples or individual quantum bits (qubits). The interdigitated-capacitor structures are designed to minimize parasitic inductance.

30 Claims, 6 Drawing Sheets

(56) References Cited

U.S. PATENT DOCUMENTS

| | | | |
|---|---|---|---|
| 4,875,025 A * | 10/1989 | Buoli | H01P 7/10 |
| | | | 333/230 |
| 5,821,827 A * | 10/1998 | Mohwinkel | H03B 5/1852 |
| | | | 331/99 |
| 6,255,816 B1 * | 7/2001 | Robitaille | G01R 33/343 |
| | | | 324/300 |
| 6,313,719 B1 * | 11/2001 | Barnett | H01P 1/20372 |
| | | | 333/202 |
| 6,400,576 B1 * | 6/2002 | Davidson | H01L 23/642 |
| | | | 174/262 |
| 6,700,459 B2 * | 3/2004 | Raihn | H01P 1/20381 |
| | | | 333/202 |
| 6,800,837 B1 | 10/2004 | Ichimura | |
| 7,181,259 B2 * | 2/2007 | Tsuzuki | H01P 1/20336 |
| | | | 333/204 |
| 7,184,555 B2 | 2/2007 | Whaley | |
| 7,423,427 B2 | 9/2008 | Brown | |
| 7,863,892 B2 | 1/2011 | Morley | |
| 8,222,629 B2 | 7/2012 | Pioro-Ladriere | |
| 8,315,969 B2 | 11/2012 | Roetteler | |
| 8,507,860 B2 * | 8/2013 | Schubert | B82Y 10/00 |
| | | | 250/336.1 |
| 8,642,998 B2 | 2/2014 | Gambetta | |
| 8,711,897 B2 * | 4/2014 | Miles | H01P 7/08 |
| | | | 333/204 |
| 8,836,439 B2 * | 9/2014 | O'Hara | H01P 7/08 |
| | | | 331/107 DP |
| 8,908,251 B2 * | 12/2014 | Sayyah | H01P 7/082 |
| | | | 359/254 |
| 9,040,922 B2 * | 5/2015 | Gomez Rivas | G01J 3/0259 |
| | | | 250/341.1 |
| 9,059,305 B2 * | 6/2015 | Abraham | H01L 27/18 |
| 9,079,043 B2 * | 7/2015 | Stark | H02J 50/80 |
| 9,194,922 B2 * | 11/2015 | Blank | G01R 33/341 |
| 9,208,445 B2 | 12/2015 | Roshen | |
| 9,293,890 B2 * | 3/2016 | Breeze | H01S 1/02 |
| 9,443,810 B1 * | 9/2016 | Lee | H01L 23/552 |
| 9,502,761 B2 | 11/2016 | Itoh | |
| 9,564,573 B1 * | 2/2017 | Chang | H01L 27/18 |
| 9,589,236 B1 * | 3/2017 | Abdo | H01L 29/778 |
| 9,691,962 B2 * | 6/2017 | Abdo | H01P 3/08 |
| 9,733,544 B2 * | 8/2017 | Sayyah | G02B 1/002 |
| 9,773,208 B2 | 9/2017 | Betz | |
| 9,812,752 B2 * | 11/2017 | Lee | H01L 21/4853 |
| 9,818,796 B2 * | 11/2017 | Abraham | H01L 28/88 |
| 9,891,297 B2 | 2/2018 | Sushkov | |
| 9,941,459 B2 * | 4/2018 | Abdo | G06N 10/00 |
| 9,947,856 B2 * | 4/2018 | Abdo | H01L 27/14629 |
| 10,145,743 B2 * | 12/2018 | Timofeev | G01J 5/024 |
| 10,199,554 B2 * | 2/2019 | Chang | H01L 39/2493 |
| 10,297,896 B2 * | 5/2019 | Desfonds | H01L 28/40 |
| 10,355,642 B2 * | 7/2019 | Caffee | H01F 17/0013 |
| 10,381,542 B2 * | 8/2019 | Chang | H01L 39/223 |
| 10,381,704 B2 * | 8/2019 | Talty | H01Q 1/125 |
| 10,468,740 B2 * | 11/2019 | Minev | H01L 39/02 |
| 10,520,365 B2 * | 12/2019 | Favero | G01J 5/10 |
| 10,847,705 B2 * | 11/2020 | Lampert | H01L 39/025 |
| 2003/0021518 A1 | 1/2003 | Smirnov | |
| 2003/0222731 A1 * | 12/2003 | Raihn | H01P 7/082 |
| | | | 333/99 S |
| 2009/0295509 A1 * | 12/2009 | Master | H01P 7/06 |
| | | | 333/219.1 |
| 2010/0177457 A1 * | 7/2010 | Willard | H01G 4/33 |
| | | | 361/301.4 |
| 2013/0093424 A1 * | 4/2013 | Blank | G01R 33/341 |
| | | | 324/316 |
| 2015/0103859 A1 * | 4/2015 | Breeze | G01R 33/343 |
| | | | 372/82 |
| 2016/0018267 A1 * | 1/2016 | Timofeev | G01J 5/024 |
| | | | 250/336.2 |
| 2016/0351309 A1 * | 12/2016 | Caffee | H03B 5/00 |
| 2016/0380026 A1 * | 12/2016 | Abraham | H01L 28/88 |
| | | | 257/31 |
| 2017/0010338 A1 | 1/2017 | Bayat | |
| 2017/0033273 A1 * | 2/2017 | Chang | H01L 39/223 |
| 2017/0077383 A1 * | 3/2017 | Chang | H01L 39/025 |
| 2017/0082083 A1 * | 3/2017 | Lowery | F02P 9/007 |
| 2017/0084813 A1 * | 3/2017 | Chang | H01L 39/223 |
| 2017/0091646 A1 * | 3/2017 | Abdo | G06N 20/00 |
| 2017/0092833 A1 * | 3/2017 | Abdo | G06N 20/00 |
| 2017/0132524 A1 * | 5/2017 | Abdo | G06N 20/00 |
| 2017/0222116 A1 * | 8/2017 | Abdo | G06N 20/00 |
| 2017/0237139 A1 * | 8/2017 | Talty | H01P 5/02 |
| | | | 333/239 |
| 2018/0069288 A1 * | 3/2018 | Minev | G06N 10/00 |
| 2018/0195983 A1 | 7/2018 | Hollenberg | |
| 2018/0248247 A1 * | 8/2018 | Desfonds | G02B 1/002 |
| 2018/0342900 A1 * | 11/2018 | Luzinski | H02J 50/402 |
| 2018/0343038 A1 * | 11/2018 | Singh | H01F 27/38 |
| 2018/0343039 A1 * | 11/2018 | Luzinski | H02J 50/402 |
| 2018/0343040 A1 * | 11/2018 | Luzinski | H01F 27/38 |
| 2018/0343041 A1 * | 11/2018 | Luzinski | H01Q 7/04 |
| 2018/0343042 A1 * | 11/2018 | Luzinski | H01Q 7/04 |
| 2019/0018090 A1 * | 1/2019 | Georget | H01Q 15/0086 |
| 2019/0044044 A1 * | 2/2019 | Lampert | H01L 39/025 |
| 2019/0074570 A1 * | 3/2019 | Friedman | G01R 33/343 |
| 2019/0094306 A1 * | 3/2019 | Kawasaki | G01R 31/3833 |
| 2019/0186456 A1 * | 6/2019 | Lowery | H05H 1/46 |
| 2019/0207289 A1 * | 7/2019 | Su | H01P 7/082 |
| 2019/0267214 A1 * | 8/2019 | Liu | H01J 37/32311 |
| 2020/0028064 A1 * | 1/2020 | Chang | H01L 39/025 |
| 2020/0043874 A1 * | 2/2020 | Sira | H01L 23/66 |
| 2021/0104626 A1 * | 4/2021 | Bramanti | H03K 17/687 |

FOREIGN PATENT DOCUMENTS

| | | | | |
|---|---|---|---|---|
| JP | H07333310 A | 12/1995 | | |
| WO | WO-2016135208 A1 * | 9/2016 | | H01L 28/10 |
| WO | 2016187676 A1 | 12/2016 | | |
| WO | WO-2017129855 A1 * | 8/2017 | | H04B 7/145 |
| WO | 2019051016 A1 | 3/2019 | | |
| WO | WO-2019051016 A1 * | 3/2019 | | G01R 33/343 |

OTHER PUBLICATIONS

International Search Report and Written Opinion mailed by the Korean Patent Office acting as the International Search Authority dated Jan. 18, 2019, 14 pages.

Ygal Twig et al. "Sensitive surface loop-gap microresonators for electron spin resonance," Review of Scientific Instruments 81, pp. 104703-1-104703-11, (Oct. 2010).

Chen, Y. et al., "Coupling Erbium Spins to a Three-Dimensional Superconducting Cavity at Zero Magnetic Field", Physical Review B, vol. 94, No. 7, pp. 1-5 (Aug. 10, 2016) Available online at [URL: https://journals.aps.org/prb/pdf/10.1103/PhysRevB.94.075117].

Koskinen, M.F., and Metz, K.R., "The Concentric Loop-Gap Resonator—A Compact, Broadly Tunable Design for NMR Applications," Journal of Magnetic Resonance, vol. 98, No. 3, pp. 576-588 (Jul. 1992).

Extended European Search Report dated May 10, 2021, in European patent application 18853629.6, 8 pages.

* cited by examiner

LOOP GAP RESONATORS FOR SPIN RESONANCE SPECTROSCOPY

STATEMENT AS TO FEDERALLY SPONSORED RESEARCH

This invention was made with Government support under U.S. National Science Foundation grant numbers DMR-1310135 and DMR-1708692. The Government has certain rights in the invention.

BACKGROUND

Electron-Spin Resonance (ESR) Spectroscopy, also called Electron Paramagnetic Resonance (EPR) Spectroscopy, is an analytical method that can be used to study the local atomic and molecular environment around unpaired electrons present in chemical species including organic and biomolecules containing metal atoms, as well as in any chemical species where radicals or unpaired electrons may be present, even transiently during a chemical reaction or other dynamic process. In most ESR spectrometers, a large magnetic field is applied to a sample of material to be analyzed, thereby inducing a spectral separation (splitting) of electron-spin states that otherwise may have the same energy as one another (degenerate states). Electromagnetic radiation generally in but not limited to the microwave spectral region is applied to the sample in the magnetic field, typically in combination with modulating the magnetic field, to make spectroscopic measurements of the sample, that is, to read a quantum state of the sample. Some ESR measurements can also be performed without the presence of an externally applied magnetic field, for example if the splitting between levels is induced by other effects, such as spin-orbit coupling. ESR is a sensitive spectroscopic technique that can be used to study very small quantities of matter.

Loop-gap resonators are components used in Electron-Spin Resonance spectrometers to concentrate the oscillating magnetic field from the applied electromagnetic radiation on the sample being studied, thereby enhancing the sensitivity of the ESR measurements. Loop-gap resonators, which are in a class of devices called "lumped-element" resonators, include both electrical inductance and capacitance in a single integrated structure that is generally constructed as a ring-shaped conductor having an interruption along its circumference.

With lumped element designs of a resonator, radiation confinement can be achieved in a length scale smaller than the wavelength of the radiation, that is, exceeding the Rayleigh limit, enabling much higher radiation fields to be produced than could be produced with cavity resonators, as are more traditionally used in ESR spectrometers. The loop, which generally encircles the sample to be analyzed, provides electrical inductance, and the gap formed by the interruption in the loop contributes electrical capacitance, which together determine the resonant frequency of the resonator. Depending on the dimensions of the sample to be studied, the loop about the sample can be fabricated as an elongated cylinder having a gap in a wall of the cylinder along its axial length, or can be made as a substantially planar loop having an interruption of the loop in the plane. Such relatively planar loops can be fabricated using any additive or subtractive fabrication method such as photolithography, etching, machining, or photodeposition, and on any size scale accessible to the selected fabrication technology.

One field in which very small samples are studied is quantum computing, where advantage is taken of quantum properties such as superposition of states and quantum entanglement to dramatically enhance the ability to address certain classes of computational problems. Quantum computing is currently a very active area of technology development and defines a great need for new devices that can work with molecular-scale samples.

Although loop-gap resonators are currently used in some ESR spectrometers for studying sample volumes on a microliter scale, continuing advancements in fields including biochemistry, nanotechnology and quantum computing have generated a need for the development of loop-gap resonators capable of supporting the ESR analysis of ever smaller samples.

SUMMARY

One aspect of the present invention is a resonator for coupling electromagnetic radiation to a sample. The resonator includes an electrically conductive member. An opening through the electrically conductive member defines an inductive loop of the resonator, and at least a portion of the sample can be positioned within the opening. An elongated, continuous gap following a convoluted path through the electrically conductive member extends between the opening and an outer boundary of the conductive member. The elongated gap contributes electrical capacitance to the resonator. The capacitance can be proportional to the length of the convoluted path, and inversely proportional to a width of the gap. The capacitance and inductance of the resonator together define a resonant frequency of the resonator.

The resonator can be fabricated by various techniques. For example, the conductive member can be a metallic or other conductive layer overlying a non-conductive or dielectric substrate. Additionally, a dielectric material can overlie or coat a portion or all of the electrically conductive member, and can be fabricated to fill in all or part of the gap along the convoluted path. This overlying dielectric layer can be applied to modify (increase) the capacitance of the resonator. The resonator can be substantially planar, for example, as manufactured using microelectronic or thin-film fabrication techniques. Alternatively, the surface of the resonator can be non-planar or the resonator can be physically flexible. The resonator can also be fabricated from bulk materials, for example, as manufactured using mechanical, chemical, electrical or optical machining techniques.

The continuous convoluted path can have any of several forms. For example, the convoluted path can include any number of straight or curved length segments with changes of direction between them. The changes of direction can be reversals of direction between length segments, forming a zig-zag path where the conductive material on opposite sides of the gap can be described as interdigitated, that is, resembling the appearance of interlaced fingers of human hands. In another embodiment (not illustrated), the capacitor is three dimensional, comprising two or more layers of conductive material defining a convoluted path and separated by dielectric layers, thereby facilitating the construction of resonators having even greater capacitance than is achievable with a single-layer conductor. For example, the capacitance of a resonator of the present invention having a second conductive layer overlying and insulated from a first conductive layer can be designed to have more than twice the capacitance of a similarly-sized resonator having only a single conductive layer. Although the changes of direction between legs are illustrated in FIG. 2 as being abrupt, these transitions can also be smooth or curved within the scope of the present invention. In various embodiments the number of changes or reversals of direction can be up to 8, up to 38, or can be any number meeting engineering and resonator performance requirements for a particular application. The inventive resonators can have physically small dimensions, for example including gap widths smaller than 10 nanometers. A sample for use with the resonator can be as small as a single magnetic molecule.

A system of the present invention is applicable to one or both of measuring and changing the quantum state of a qubit, such as can be used in a quantum computer. The system includes a resonator of the present invention, a sample positioned at least partially within the opening of the resonator, and external means for simultaneously applying a magnetic field and electromagnetic radiation at a resonant frequency of the resonator, for inducing a resonance in the sample.

Another aspect of the present invention is a method for measuring and changing a quantum state of a sample. The method includes positioning at least a portion of the sample within an opening of a loop-gap resonator having a capacitance defined by a convoluted gap extending between the opening and an outer edge of the resonator, simultaneously exposing the sample to a magnetic field and electromagnetic radiation and detecting a resonance signal from the sample. The opening and the portion of the sample positioned in the opening can have physical dimensions as small as 10 nanometers or smaller.

Other features and advantages of various aspects and embodiments of the present invention will become apparent from the following description and from the claims.

BRIEF DESCRIPTION OF THE DRAWINGS

This invention is described with particularity in the appended claims. The above and further aspects of this invention may be better understood by referring to the following description in conjunction with the accompanying drawings, in which like numerals indicate like structural elements and features in various figures. The drawings are not necessarily to scale, emphasis instead being placed upon illustrating the principles of the invention.

DETAILED DESCRIPTION

Improvements to loop-gap resonators for use in ESR measurements and quantum computing are disclosed herein.

In these applications, a loop-gap resonator advantageously enhances sensitivity of the measurement or reading of a quantum state and provides a large, fairly uniform, oscillating magnetic field at the location where the sample is positioned for analysis.

Figure 1:
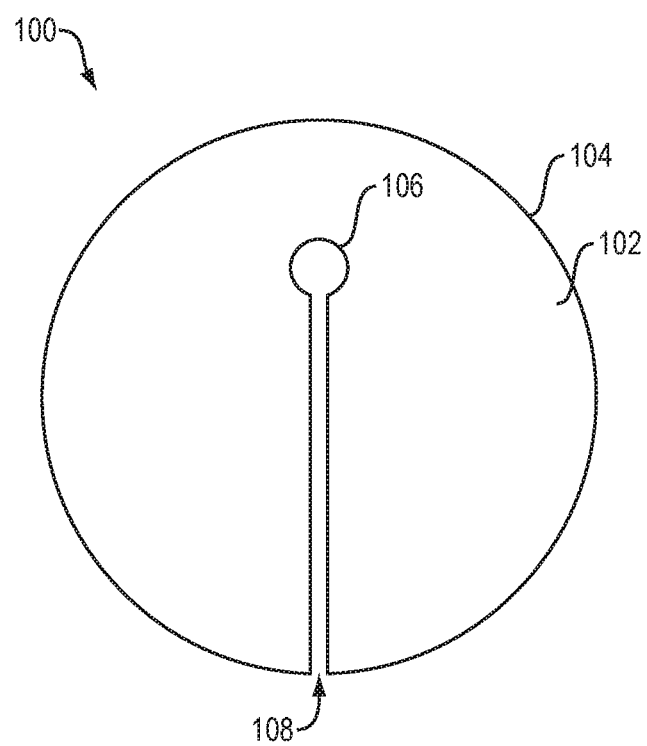
FIG. 1 schematically illustrates a prior art loop-gap resonator as could be used in an ESR spectrometer.

FIG. 1 schematically illustrates a prior art loop-gap resonator 100 as could be used in an ESR spectrometer. The resonator 100 is seen to comprise an approximately circular conductive disc 102 having an outer substantially circumferential boundary 104 and an opening 106 through the disc 102, the opening 106 being located entirely within the boundary 104 and having an area suitable for receiving a sample therein. The resonator 100 is illustrated as substantially planar and viewed from above the plane, but can in principle have any thickness along an axis perpendicular to the plane. For use in ESR measurements, the sample being studied is positioned substantially within the opening 106. The conductive path about the opening 106 comprises the loop of the loop-gap resonator 100 and contributes inductance thereto. The resonator 100 is also seen to include a physical gap 108 that interrupts the loop about the opening 106 and extending from the opening 106 to the boundary 104, the gap 108 comprising capacitance. The loop-gap resonator 100 is thus substantially an LC resonator having a resonant frequency proportional to 1/sqrt(LC), where L represents inductance and C represents capacitance.

The energies that correspond with a detectable splitting of the electronic spin states for ESR are broadly in the microwave radiation region of the electromagnetic spectrum, and are dependent on the strength of the applied magnetic field. The majority of commercial ESR spectrometers operate in what is generally called the X-band, in the frequency range of approximately 8 to 12 GHz (Gigahertz), but this is by no means limiting, and ESR measurements can in principle be made in any portion of the microwave and adjacent spectral regions, for example, extending to the radio-frequency (RF), millimeter-wave, Terahertz or optical frequency ranges.

Microwave radiation is typically channeled to the resonator by waveguides or coaxial cables for making ESR measurements. In addition, the dimensions of the waveguides and the resonator are specific to the electromagnetic radiation frequency at which measurements are being made. Operating parameters of ESR measurement apparatus may include microwave power (amplitude), magnetic field strength and direction, sample orientation (in the case of crystalline samples), and the design of the resonator. To obtain an optimum ESR signal, the physical dimensions of a resonator in which a sample is positioned are preferably well matched to those of the sample.

An aspect of the present invention is provision of a loop-gap resonator for studying very small samples, such as samples of rare or difficult-to-synthesize biochemical species, and nanoscale devices such as those used in the development of quantum information technology, where an objective is to make ESR measurements of quantum states of only a few or even a single atomic or molecular scale specie or one or more nanometer-scale artificially fabricated device, such as a quantum dot or a chemically synthesized magnetic molecule. Providing an extremely small cross-section loop in a loop-gap resonator is desirable for studying such samples. At any selected microwave frequency, reducing the dimensions of the loop reduces its inductance, and a correspondingly greater capacitance is required to maintain a target resonant frequency of the resonator.

Figure 2:
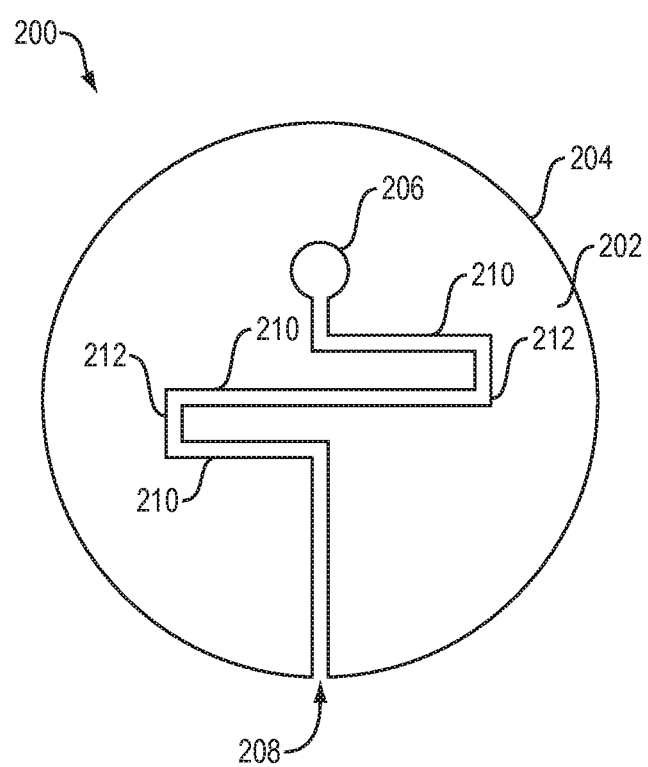
FIG. 2 schematically illustrates a loop-gap resonator according to the present invention having a zig-zag gap path with two direction reversals.

A loop-gap resonator 200 according to the present invention is illustrated schematically in FIG. 2. The resonator 200 is seen to comprise a conductive disc 202 having an outer boundary 204 and a through opening 206, similar to the corresponding elements 102, 104 and 106 illustrated in FIG. 1. Although illustrated in FIG. 2 as substantially disc-shaped in cross-section, loop-gap resonators according to the present invention can have any cross-sectional shape that meets engineering needs for a particular design of a loop-gap resonator. The opening 206 comprises the loop of the loop-gap resonator 200. The inventive resonator 200, and other resonators disclosed herein, are for illustrative purposes shown in the Figures as substantially planar (for example, thin-film devices fabricated on a planar substrate) and viewed from above the plane, but the inventive resonators can in principle have any thickness perpendicular to the illustrated surface. Further, resonators according to the present invention can have a curved surface, for example by being fabricated on a curved substrate surface, or can be fabricated from flexible materials so that the product device can be flexed or bent while maintaining functionality as a resonator. It is to be understood that all embodiments of resonators disclosed herein are intended to include curved as well as planar surfaces.

In contrast to the linear gap 108 illustrated in FIG. 1, the loop-gap resonator 200 of FIG. 2 includes a gap 208 comprising a convoluted path between the opening 206 and the boundary 204. The convoluted path is seen to comprise a plurality of legs 210 alternately extending in opposite directions, thus deviating from an imaginary straight path between the opening 206 and the boundary 204. The legs 210 are seen to be interconnected by turns 212 at their respective ends, illustrated in the Figure as reversing the direction of the continuous path. We herein refer to this pattern as a zig-zag path, and refer to the capacitive structure illustrated in FIG. 2 as being interdigitated (that is, superficially resembling fingers of interlaced hands), here descriptive of portions of opposite sides of the gap 208 extending across an imaginary straight path between the opening 206 and the boundary 204, without making electrical contact.

The interdigitated structure illustrated in FIG. 2 increases the capacitance approximately proportionally to the increase in the length of the path relative to that of the resonator illustrated in FIG. 1, and allows the opening 206 to be correspondingly smaller for a given resonant frequency. A smaller opening (loop) provides an enhancement of the radiation magnetic field therein, where the sample is located. This design promises greater sensitivity and a corresponding ability to study smaller samples.

A further feature of the interdigitated capacitor structure is that electrical current flows in opposite directions along alternate legs of the path, causing the corresponding magnetic fields to cancel out to first order. This results in a very low inductance of the capacitor. In summary, the inventive design enables the capacitance of the loop-gap resonator 200 to be dramatically increased without introducing significant parasitic inductance. In addition, the capacitance of a loop-gap resonator of the present invention can be tuned to a desired value by controlled placement or deposition of a dielectric material over or within the gap. One nonlimiting example of a dielectric material that could be used in this manner is sapphire (alumina). In an embodiment, the resonant frequency is lowered by addition of the overlying dielectric material. In an embodiment, the number of turns 212 in direction along the path of the gap 208 is an even number. In a further embodiment, an even number of reversals in direction supports cancellation of magnetic fields along adjacent legs 210.

More generally, the convoluted path can include any number of legs and any number of changes in direction therebetween that facilitate increasing the effective length of the path between an opening and a boundary of a loop-gap resonator according to the present invention. For example, whereas consecutive legs 210 are illustrated as being oriented approximately parallel to one another in FIG. 2, in other embodiments, consecutive legs can be oriented at non-zero angles to one another. In yet another embodiment the legs are themselves curved.

Figure 3:
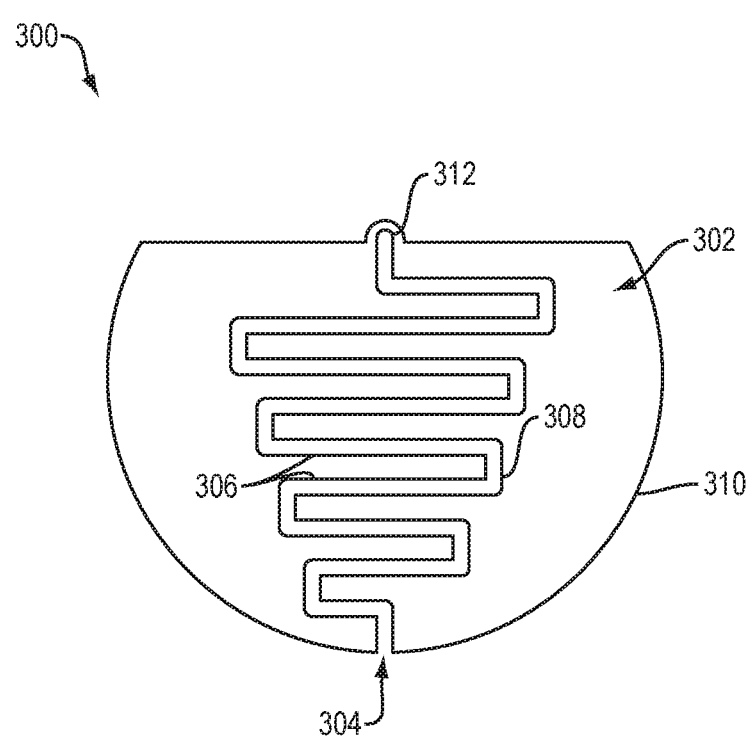
FIG. 3 schematically illustrates a loop-gap resonator according to the present invention having a zig-zag gap path comprising legs that decrease in length toward the external boundary of the resonator, and defining a loop having a cross-section equal to the cross-section of the gap.

FIG. 3 schematically illustrates another embodiment of a loop-gap resonator 300 according to the present invention, wherein an interdigitated capacitor structure 302 defines a convoluted path, illustrated as a zig-zag path, along a gap 304 having a plurality of legs 306 and corresponding changes in direction 308, providing a further increase in the length of the gap 304 and a corresponding increase in capacitance, relative to the loop-gap resonator 200 illustrated in FIG. 2. In the illustrated embodiment, the zig-zag path of the gap 304 comprises eight reversals in direction. In various other embodiments, the number of changes in direction designed into the zig-zag path is determined by one or more of the amount of capacitance desirable for a particular application of a resonator, the amount of physical space available in the resonator, and the width of the gap, which is approximately inversely proportional to the capacitance. Nonlimiting examples of embodiments include any number from 2 through 38 changes in direction (as illustrated in FIG. 4 herein below) and any larger numbers of changes in direction as may be required to achieve a desired capacitance in a resonator.

In another embodiment, the lengths of consecutive legs 306 along the path increases along the path from a boundary 310 of the resonator 300 toward an opening 312 through the resonator 300. In yet another embodiment, a diameter of the opening 312 is no larger than a width of the gap 304. In a further embodiment, the opening 312 comprises a terminus of the gap 304. In still another embodiment, the opening 312 comprises a semicircular end of the gap 304. In addition, it can be seen in FIG. 3 that excess material has been removed from about the opening along the boundary 310, which may provide a further reduction of the inductance of the resonator.

Figure 4:
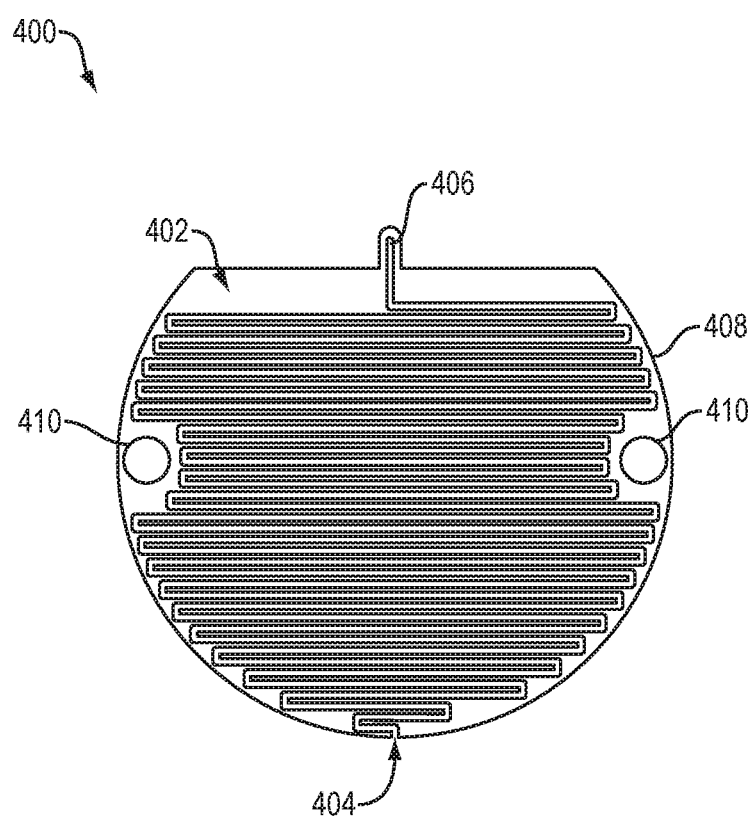
FIG. 4 schematically illustrates a loop-gap resonator according to the present invention having a zig-zag gap path comprising legs that increase in length and then decreases in length, such that the path occupies most of the available surface area of the resonator.

FIG. 4 schematically illustrates still another embodiment of a loop-gap resonator 400 according to the present invention, wherein an interdigitated capacitor structure 402 and corresponding zig-zag path along a gap 404 is configured to fill the majority of the area of the resonator 400 between an opening 406 and a boundary 408 of the resonator 400, illustrating an exemplary embodiment that maximizes the capacitance of the resonator for a given gap width. In this embodiment, the length of the legs first increases and then decreases with distance from the opening 406, to maximize use of the available surface area and capacitance of the resonator 400. In an embodiment, the path follows physical constraints associated with a design of the resonator 400, such as attachment means 410 for mounting the resonator 400 to another structure (not illustrated). As illustrated, the resonator 400 is shown to comprise 38 reversals of direction in the zig-zag path. Modeling of the embodiment of FIG. 4 using High Frequency Electromagnetic Field System software from ANSYS Inc., Canonsburg, Pa., predicted the radiation magnetic field in the opening to be enhanced by a factor of approximately 21 relative to the prior-art loop-gap resonator design illustrated in FIG. 1.

Figure 5:
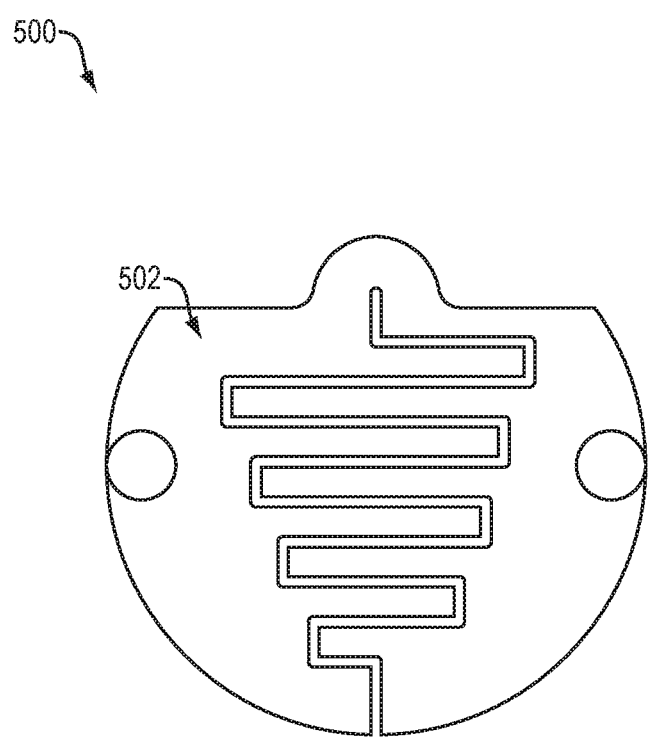
FIG. 5 illustrates an exemplary embodiment of a loop-gap resonator according to the present invention, fabricated using conventional machining methods.

FIG. 5 schematically illustrates an exemplary embodiment of a loop-gap resonator 500 according to the present invention, including a tapered, interdigitated capacitor structure 502. The resonator 500 is approximately 1 cm in diameter and was fabricated from oxygen-free copper using conventional machining methods. In initial tests using a laboratory-made ESR spectrometer, the resonator operated at its design frequency of 1.5 GHz and had a Q (Quality) factor of 600. A similar resonator having a straight path of a prior-art design was found to have a frequency of 4.5 GHz and Q of approximately 1500.

Figure 6:
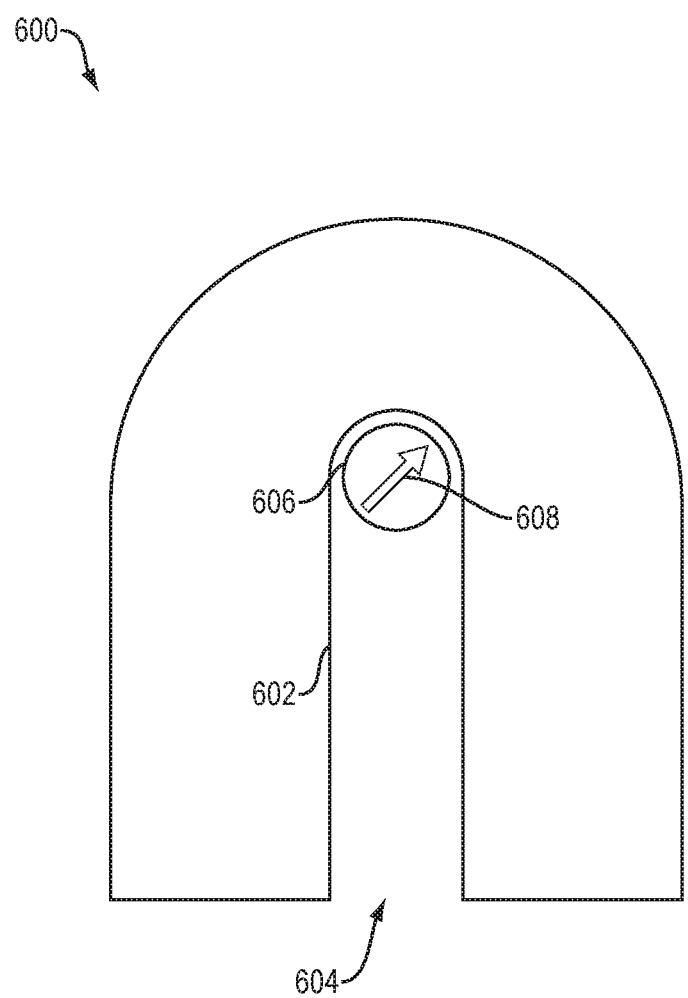
FIG. 6 schematically illustrates an application of a loop-gap resonator according to the present invention to quantum computing.

Loop-gap resonators according to the present invention can provide high radiation fields in resonators smaller in size than the wavelength of the radiation used to interact with a sample contained therein, making them excellent devices for controlling and measuring the quantum state of qubits, which are fundamental building blocks for quantum computing, using pulsed-radiation techniques. FIG. 6 schematically illustrates a nanoscale loop-gap resonator 600 according to the present invention, for application to quantum computing. In one embodiment the dimensions of the loop-gap resonator 600 are scaled to provide coupling to a single molecular magnet, which would behave as a qubit. A resonator according to the present invention would allow the manipulation, control and read-out of the qubit's quantum state. In an embodiment, the manipulation, control or read-out of the qubit's quantum state comprises the application of pulses of electromagnetic radiation to the resonator.

The resonator 600 is seen to comprise an opening 602 that functionally parallels the opening 406 of the resonator 400 of FIG. 4. Also illustrated in FIG. 6 is a portion of a gap 604 that functionally parallels the gap 404 illustrated in FIG. 4. The remainder of the gap 604 is not shown in FIG. 6, but follows a path functionally similar to the interdigitated, zig-zag pattern of FIG. 4. In a non-limiting example, the opening 602 contains a sample 606 (illustrated as a circle in FIG. 6) comprising a single magnetic molecule having a quantum state 608 (represented as an arrow) that can be manipulated, controlled and measured using a spin-resonance technique such as ESR or NMR (Nuclear Magnetic Resonance) spectroscopy. In various embodiments the sample 606 can be any chemical or molecular species suitable for measurement using spin-resonance spectroscopic techniques, or any quantum object that embodies a qubit, nonlimiting examples of which include single magnetic molecules, quantum dots, and nitrogen vacancy color centers in diamond. Examples of suitable magnetic species may include $Cr_7M$ molecular rings, where M can be a transition-metal ion such as Ni, Co, or Mn. In an embodiment, the quantum object is a superconducting (Josephson) device. In a nonlimiting embodiment, the opening 602 has a cross-sectional dimension in the range of one to 10 nanometers. In various embodiments, the quantum state 608 is one of an electron spin state, or a nuclear spin state. In an embodiment, the loop-gap resonator 600 comprises a read-and-control circuit for single or multiple qubits in a quantum computer.

An exemplary system according to the present invention includes a loop-gap resonator of the present invention, a sample positioned at least partially within an opening of the resonator, a source of a magnetic field that can be applied to the resonator, and a source of electromagnetic radiation having a frequency selected to match a resonance of the loop-gap resonator.

It is to be understood that although the invention has been described above in terms of particular embodiments, the foregoing embodiments are provided as illustrative examples only, and do not limit or define the scope of the invention. Various other embodiments, including but not limited to the following, are also within the scope of the claims. For example, elements and components described herein may be further divided into additional components or joined together to form fewer components for performing the same functions. Moreover, a resonator according to the present invention can contain more than a single opening, with the path connecting one opening to another instead of terminating at a boundary.

In addition, resonators disclosed herein are illustrated as being cylindrical, or circular and substantially planar in shape, but many other shapes are also possible, including other geometric shapes or more complex shapes selected to optimize resonator performance. Further, loop-gap resonators according to the present invention can be fabricated as curved or flexible devices. In addition to applications in ESR and quantum computing, resonators of the present invention have application in nuclear magnetic resonance (NMR) and to other arts that employ high-frequency resonators.

What is claimed is:

1. A resonator for coupling electromagnetic radiation to a sample on the scale of a quantum object embodying a qubit, the resonator comprising: an electrically conductive member; an opening through the member defining an inductive loop in the member, the sample at least partially receivable within the opening; and an elongated gap in the member defining a continuous convoluted path having a length between a boundary of the member and the opening, wherein the continuous convoluted path comprises a plurality of path segments and changes of direction therebetween, wherein the electrically conductive member comprises an interdigitated capacitor, wherein the interdigitated capacitor comprises a plurality of interlaced legs, wherein electrical current flows in opposite directions along alternate legs within the plurality of interlaced legs, thereby causing the corresponding magnetic fields to cancel out to a first order approximation, whereby parasitic inductance of the interdigitated capacitor is minimized.

2. The resonator according to claim 1 wherein the conductive member comprises a metallic layer overlying a dielectric substrate.

3. The resonator according to claim 1 wherein the conductive member is substantially planar.

4. The resonator according to claim 1 further comprising a dielectric material overlies at least a portion of the conductive member and filling at least a portion of the gap.

5. The resonator according to claim 1 wherein the length of the continuous convoluted path is substantially proportional to a capacitance of the resonator and a width of the gap is substantially inversely proportional to a capacitance of the resonator.

6. The resonator according to claim 1 wherein a plurality of adjacent path segments and reversals define an interdigitated structure in the conductive member.

7. The resonator according to claim 1 wherein the path comprises at least 8 changes of direction.

8. The resonator according to claim 1 wherein the largest transverse dimension of the opening is no greater than a minimum width of the gap.

9. A system for at least one of measuring and changing a quantum state of one or more qubit, the system comprising: the resonator according to claim 1; a sample positioned at least partially within the opening; an external source of a magnetic field applicable to the resonator, and a source of electromagnetic radiation applicable to the resonator and having a frequency selected to induce a resonance in the sample.

10. A method for at least one of measuring and changing a quantum state of a sample on the scale of a quantum object embodying a qubit, the method comprising: positioning at least a portion of the sample within an opening of a loop-gap resonator having a capacitance defined by a continuous convoluted gap, defining a continuous convoluted path having a length between a boundary of the member and the opening, extending between the opening and an outer edge of the resonator; simultaneously exposing the sample to a magnetic field and electromagnetic radiation; and detecting a resonance signal from the sample; wherein the loop-gap resonator comprises an electrically conductive member; wherein the opening comprises an opening through the member defining an inductive loop in the member; wherein the continuous convoluted path comprises a plurality of path segments and changes of direction therebetween, wherein the electrically conductive member comprises an interdigitated capacitor, wherein the interdigitated capacitor comprises a plurality of interlaced legs, wherein electrical current flows in opposite directions along alternate legs within the plurality of interlaced legs, thereby causing the corresponding magnetic fields to cancel out to a first order approximation, whereby parasitic inductance of the interdigitated capacitor is minimized.

11. A resonator for coupling electromagnetic radiation to a sample on the scale of a quantum object embodying a qubit, the resonator comprising: an electrically conductive member defining a surface, the member having an area and external boundary about the area on the surface, the conductive member having a thickness substantially perpendicular to the surface; an opening for receiving the sample, the opening extending entirely through the thickness; and a continuous elongated gap extending entirely through the thickness and along a continuous convoluted path joining the opening to the boundary, the path including a plurality of adjacent length segments and changes of direction therebetween; a width of the gap and a length of the path defining a capacitance of the resonator; wherein the electrically conductive member comprises an interdigitated capacitor, wherein the interdigitated capacitor comprises a plurality of interlaced legs, wherein electrical current flows in opposite directions along alternate legs within the plurality of interlaced legs, thereby causing the corresponding magnetic fields to cancel out to a first order approximation, whereby parasitic inductance of the interdigitated capacitor is minimized.

12. The resonator according to claim 11 wherein the surface is planar.

13. The resonator according to claim 11 wherein one or more of the changes of direction comprises a reversal of direction between adjacent segments.

14. The resonator according to claim 11 wherein the path comprises an interdigitated structure.

15. The resonator according to claim 1 further comprising a dielectric material, wherein the dielectric material fills at least a portion of the gap.

16. The resonator of claim 1, wherein the sample consists of a single magnetic molecule.

17. The method of claim 10, wherein the sample consists of a single magnetic molecule.

18. The resonator of claim 11, wherein the sample consists of a single magnetic molecule.

19. The resonator of claim 1, wherein the change of direction therebetween are even in number, thereby supporting cancellation of magnetic fields along adjacent ones of the plurality of legs.

20. The method of claim 10, wherein the change of direction therebetween are even in number, thereby supporting cancellation of magnetic fields along adjacent ones of the plurality of legs.

21. The resonator of claim 11, wherein change of direction therebetween are even in number, thereby supporting cancellation of magnetic fields along adjacent ones of the plurality of legs.

22. The resonator of claim 1, wherein at least a portion of the length of the elongated gap has a gap width of less than 10 nanometers; and wherein the opening is less than 10 nanometers wide.

23. The method of claim 10, wherein at least a portion of the length of the elongated gap has a gap width of less than 10 nanometers; and wherein the opening is less than 10 nanometers wide.

24. The resonator of claim 11, wherein at least a portion of the length of the elongated gap has a gap width of less than 10 nanometers; and wherein the opening is less than 10 nanometers wide.

25. The resonator of claim 1, whereby parasitic inductance of the resonator is minimized.

26. The method of claim 10, whereby parasitic inductance of the resonator is minimized.

27. The resonator of claim 11, whereby parasitic inductance of the resonator is minimized.

28. The resonator of claim 1, wherein the sample comprises a qubit.

29. The method of claim 10, wherein the sample comprises a qubit.

30. The resonator of claim 11, wherein the sample comprises a qubit.

* * * * *